(12) United States Patent
Campbell et al.

(10) Patent No.: US 7,707,880 B2
(45) Date of Patent: May 4, 2010

(54) MONITORING METHOD AND SYSTEM FOR DETERMINING RACK AIRFLOW RATE AND RACK POWER CONSUMPTION

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 12/031,976

(22) Filed: Feb. 15, 2008

(65) Prior Publication Data

US 2009/0205416 A1    Aug. 20, 2009

(51) Int. Cl.
*G01F 1/68* (2006.01)
(52) U.S. Cl. .................................... 73/202.5
(58) Field of Classification Search ............... 73/202.5; 361/695, 727; 62/180; 165/80.4
See application file for complete search history.

(56) References Cited

U.S. PATENT DOCUMENTS

| | | | |
|---|---|---|---|
| 6,201,690 B1 * | 3/2001 | Moore et al. | 361/679.21 |
| 6,373,695 B1 * | 4/2002 | Cheng | 361/679.39 |
| 6,574,104 B2 | 6/2003 | Patel et al. | |
| 6,775,997 B2 | 8/2004 | Bash et al. | |
| 7,011,143 B2 | 3/2006 | Corrado et al. | |
| 2005/0023363 A1 | 2/2005 | Sharma et al. | |
| 2005/0235671 A1 | 10/2005 | Belady et al. | |
| 2006/0232945 A1 | 10/2006 | Chu et al. | |

* cited by examiner

*Primary Examiner*—Jewel Thompson
(74) *Attorney, Agent, or Firm*—Geraldine Monteleone, Esq.; Kevin P. Radigan, Esq.; Heslin Rothenberg Farley & Mesiti P.C.

(57) ABSTRACT

Monitoring method and system are provided for dynamically determining rack airflow rate and rack power consumption employing a heat exchanger disposed at an air outlet side of the electronics rack. The method includes: sensing air temperature at the air outlet side of the electronics rack, sensing coolant temperature at a coolant inlet and coolant temperature at a coolant outlet of the heat exchanger, and determining airflow rate through the electronics rack; and outputting the determined airflow rate through the electronics rack. The determining employs the sensed air temperature at the air outlet side of the rack and the sensed coolant temperatures at the coolant inlet and outlet of the heat exchanger. In one embodiment, the heat exchanger is an air-to-air heat exchanger, and in another embodiment, the heat exchanger is an air-to-liquid heat exchanger.

20 Claims, 9 Drawing Sheets

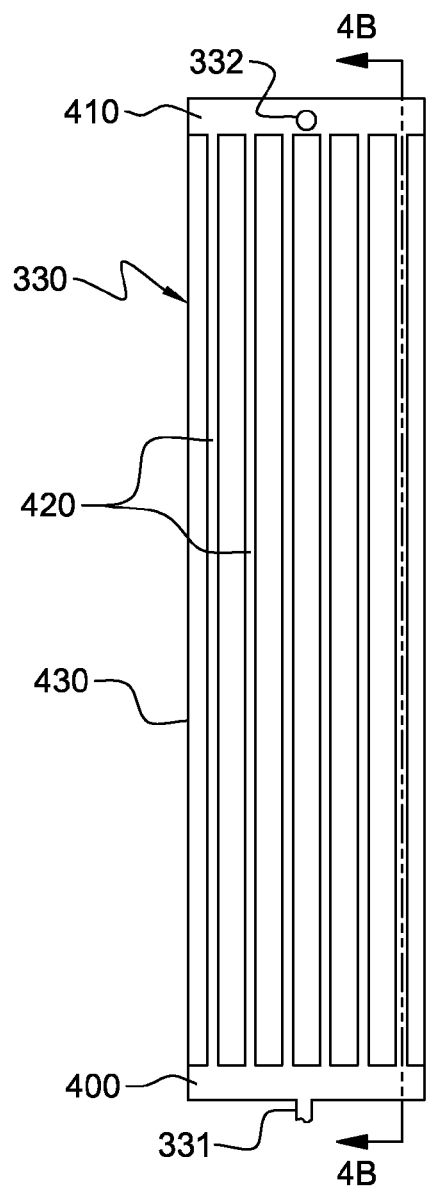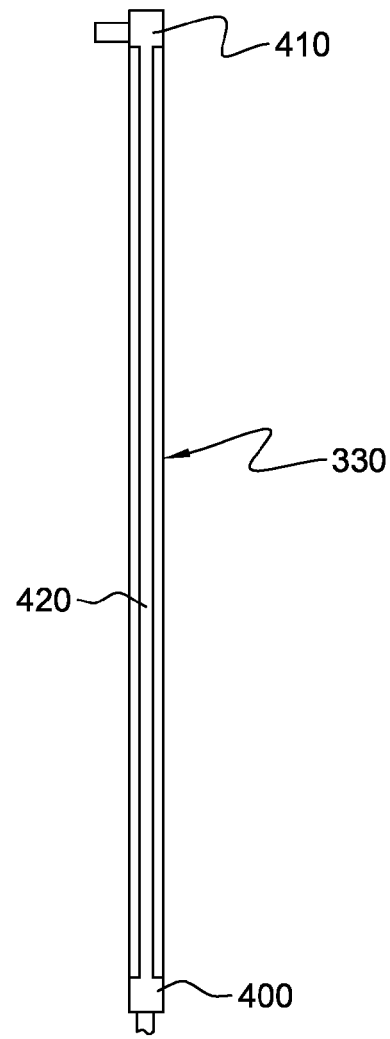
FIG. 4A
FIG. 4B

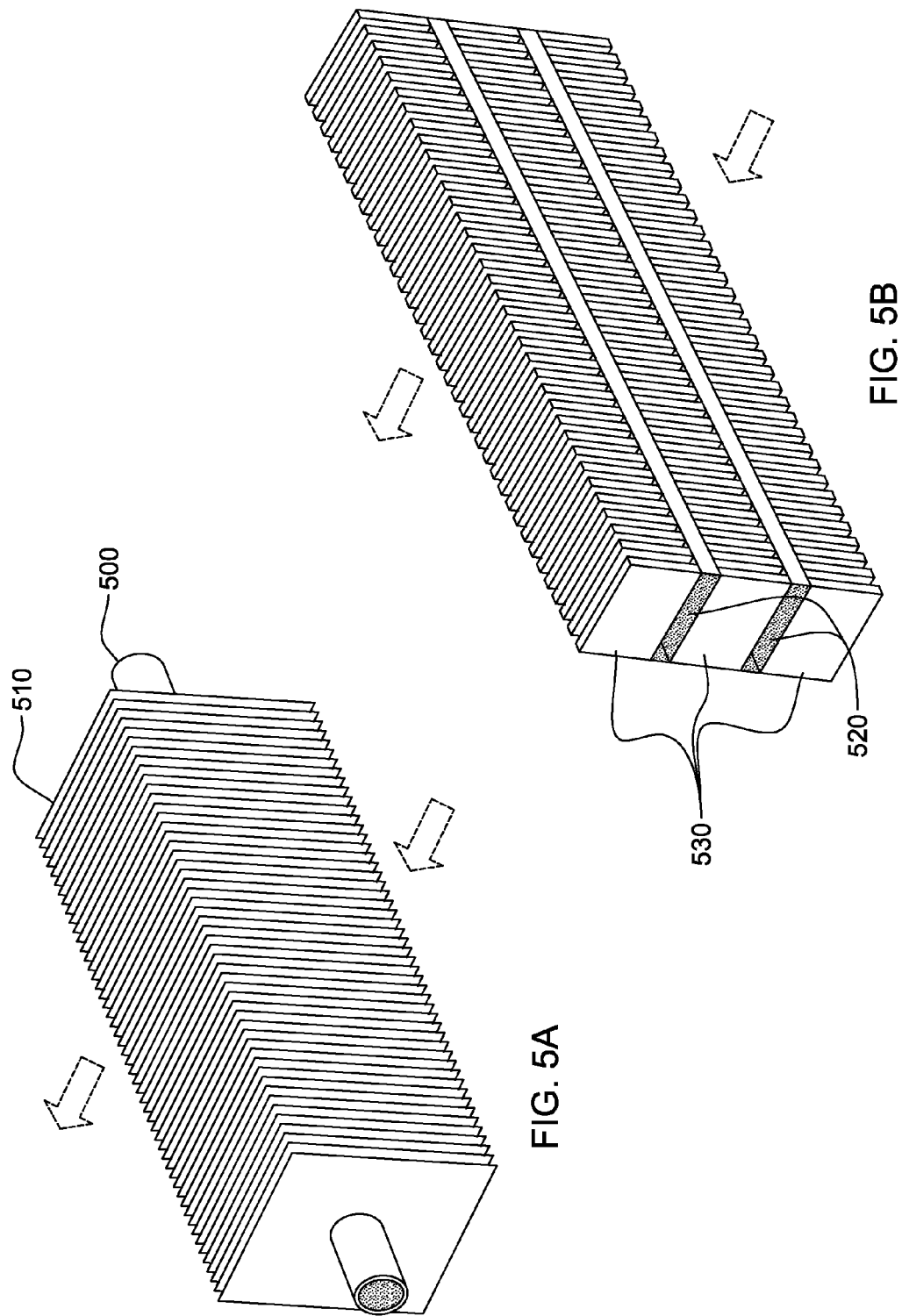

MONITORING METHOD AND SYSTEM FOR DETERMINING RACK AIRFLOW RATE AND RACK POWER CONSUMPTION

TECHNICAL FIELD

The present invention relates in general to computer room or data center monitoring and management, and more particularly, to monitoring methods and systems for ascertaining airflow rate through and power consumption of an electronics rack to facilitate management of cooling within a data center containing one or more electronics racks.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

SUMMARY OF THE INVENTION

The shortcomings of the prior art are overcome and additional advantages are provided in one aspect through the provision of a method of monitoring an electronics rack which includes a heat exchanger disposed at an air outlet side thereof. The method includes: sensing air temperature at the air outlet side of the electronics rack; sensing coolant temperature at a coolant inlet to the heat exchanger and coolant temperature at a coolant outlet of the heat exchanger; determining at least one of airflow rate through the electronics rack or power being consumed by the electronics rack, the determining employing the sensed air temperature at the air outlet side of the electronics rack and the sensed coolant temperatures at the coolant inlet and outlet of the heat exchanger, wherein a known percentage of air egressing from the electronics rack passes through the heat exchanger; and outputting the determined airflow rate through the electronics rack and/or power being consumed at the electronics rack.

In a further aspect, a monitoring system for an electronics rack is presented. The monitoring system includes: a heat exchange assembly disposed at an air outlet side of the electronics rack; at least one temperature sensor disposed at the air outlet side of the electronics rack between the electronics rack and the heat exchange assembly; a coolant temperature sensor disposed to sense coolant temperature at the inlet to the heat exchanger and a coolant temperature sensor disposed to sense coolant temperature at the outlet of the heat exchanger; and a control unit coupled to the temperature sensors for obtaining sensed temperature values and for employing the sensed temperature values in dynamically determining and outputting at least one of airflow rate through the electronics rack and power being consumed at the electronics rack.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4A is an elevational view of one detailed embodiment of a heat exchange assembly employable in the monitoring methods and systems described herein, in accordance with an aspect of the present invention;

FIG. 4B is a side elevational view of the heat exchanger embodiment of FIG. 4A, in accordance with an aspect of the present invention;

FIG. 5A is a partial isometric view of an alternate heat exchange assembly embodiment, in accordance with an aspect of the present invention;

FIG. 5B is a partial isometric view of another alternate heat exchange assembly embodiment, in accordance with an aspect of the present invention;

DETAILED DESCRIPTION OF THE INVENTION

Figure 1:
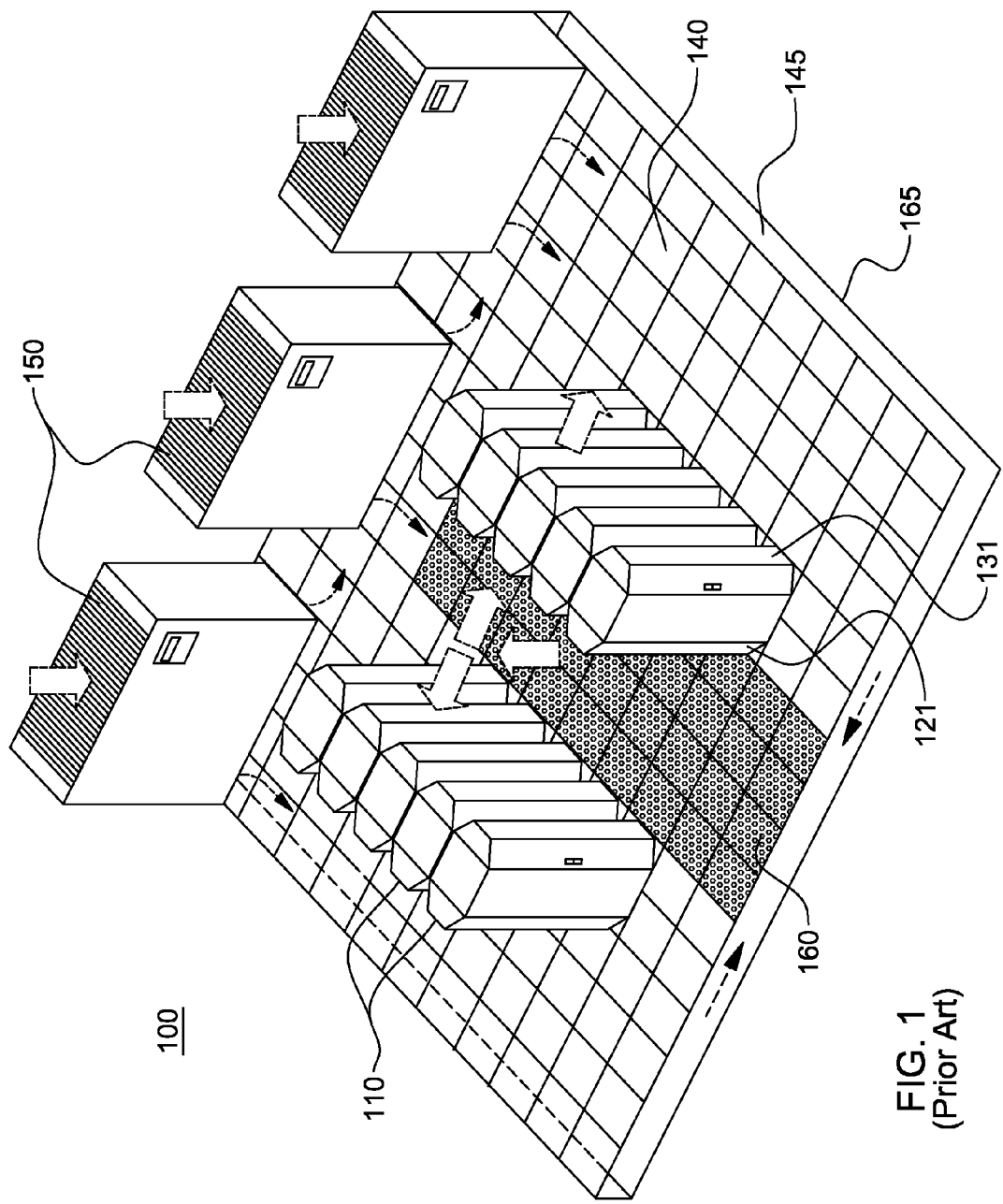
FIG. 1 depicts one embodiment of a data center room layout illustrating a plurality of electronics racks to be monitored, in accordance with one or more aspects of the present invention.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of subsystems of an electronics rack to be cooled.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal communication with a plurality of air-cooled cooling fins. Size, configuration and construction of the air-to-liquid heat exchange assembly and/or air-to-liquid heat exchanger thereof can vary without departing from the scope of the invention disclosed herein. An "air-to-air heat exchange assembly" may comprise, for example, any heat exchange mechanism characterized as described herein through which cooled air can circulate; and includes one or more discrete air-to-air heat exchangers coupled either in-series or in-parallel. An air-to-air heat exchanger may comprise, for example, one or more coolant flow paths, formed of thermally conductive tubing (such as copper or other tubing) in thermal communication with a plurality of air-cooled cooling fins. Size, configuration and construction of the air-to-air heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of liquid coolant employed in an air-to-liquid heat exchange assembly is water. However, the concepts disclosed herein are readily adapted to use with other types of liquid coolant. For example, one or more of the liquid coolants may comprise a brine, a fluorocarbon liquid, a liquid metal, or other similar coolant, or refrigerant, while still maintaining the advantages and unique features of the present invention. Further, as explained further below, in various embodiments, an air-to-air heat exchange assembly may be employed wherein the coolant is cooled air forced or drawn through the heat exchanger. Thus, unless otherwise specified, the word "coolant" is used herein as either a gaseous coolant or a liquid coolant.

Reference is made below to the drawings, which are not drawn to scale for reasons of understanding, wherein the same reference numbers used throughout different figures designate the same or similar components.

FIG. 1 depicts one embodiment of a raised floor, data center room layout 100 typical in the prior art. In this layout, multiple electronics racks 110 are disposed in one or more rows. A computer installation such as depicted in FIG. 1 may house several hundred, or even several thousand, microprocessors. In the arrangement of FIG. 1, chilled air enters the computer room via floor vents 160 from a supply air plenum 145 defined between the raised floor 140 and a base or sub-floor 165 of the room. Cooled air is taken in through louvered front covers 121 at air inlet sides of the electronics racks 110 and expelled through the back covers 131 (at the air outlet sides) of the electronics racks. Each electronics rack 110 may have an air moving device (e.g., fan or blower) to provide forced inlet-to-outlet airflow to cool the electronics within the subsystem(s) of the rack. The supply air plenum 145 provides conditioned and cooled air to the air inlet sides of the electronics racks via perforated floor tiles 160 disposed in a "cold" aisle of the computer installation. The conditioned and cooled air is supplied to plenum 145 by one or more air-conditioning units 150, also disposed within the computer installation 100. Room air is taken into each air-conditioning unit 150 near an upper portion thereof. This room air comprises in part exhausted air from the "hot" aisles of the computer installation defined, for example, by opposing air outlet sides of the electronics racks 110.

Figure 2A:
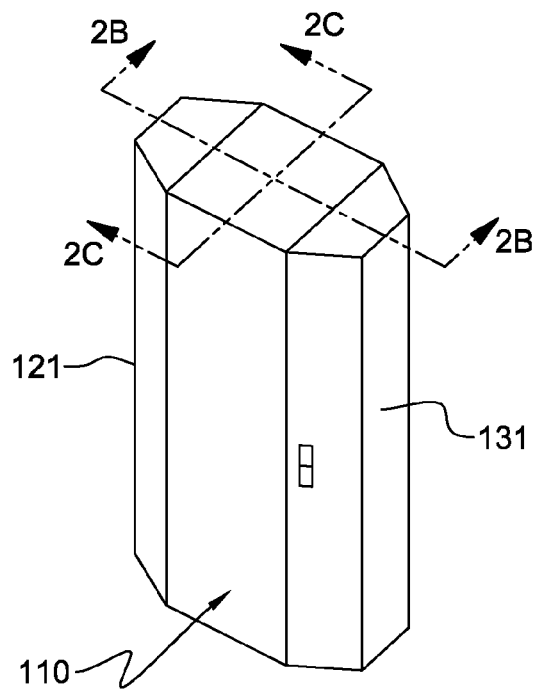
FIG. 2A is an isometric view of one electronics rack of the plurality of electronics racks depicted in FIG. 1, in accordance with an aspect of the present invention.
Figure 2B:
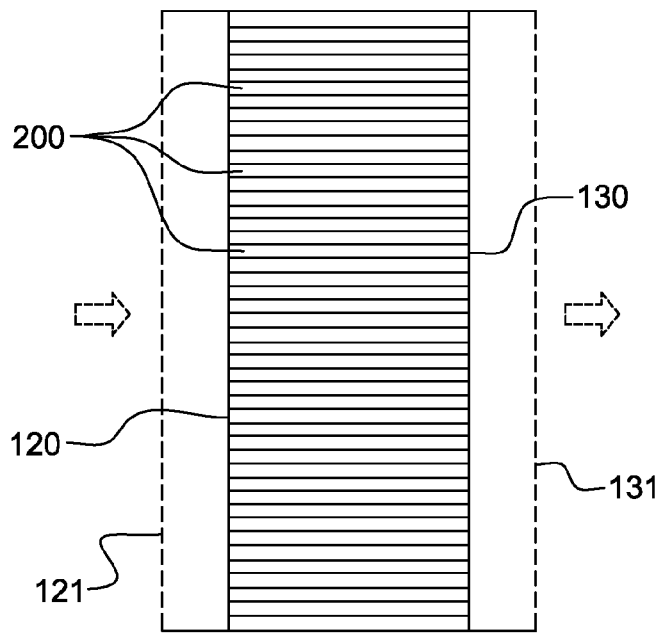
FIG. 2B is a cross-sectional elevational view of the electronics rack of FIG. 2A, taken along line 2B-2B, in accordance with an aspect of the present invention.
Figure 2C:
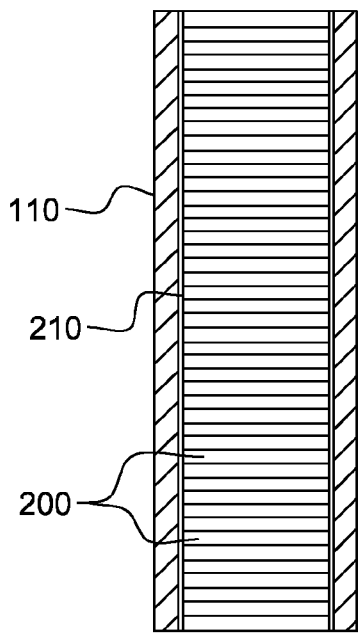
FIG. 2C is a cross-sectional elevational view of the electronics rack of FIG. 2A, taken along line 2C-2C, in accordance with an aspect of the present invention.

FIGS. 2A-2C depict one embodiment of a single electronics rack of the multiple electronics racks depicted in FIG. 1. Referring collectively to these drawings, electronics rack 110 includes an air inlet side 120 covered by front cover 121 and an air outlet side 130 covered by back cover 131. In this embodiment, electronics rack 110 comprises a plurality of horizontally-disposed electronics subsystems 200, such as a plurality of server nodes. As shown, airflow is front-to-back via perforated openings in the front cover 121 and back cover 131 of the electronics rack. As air flows through the electronics rack, it passes over the server nodes 200, which in this embodiment, are positioned horizontally via rails 210 within electronics rack 110. The front and rear covers at the air inlet and air outlet sides of the electronics rack may include slanted corners, as illustrated in FIG. 2A, to facilitate pivoted opening of the front and back covers.

Limiting factors for cooling an air-cooled data center such as depicted in FIG. 1 are related to the maximum chilled airflow rate that can be supplied from a single perforated tile, the maximum cooling capabilities of each air-conditioning unit, and the hot air recirculation phenomenon that is common in these systems. Hot air recirculation occurs when the total airflow rate of supplied chilled air in front of an electronics rack is less than the total rack airflow rate, leading to the hot exhaust air from one electronics rack being drawn into the intake of the same or another electronics rack, thus potentially resulting in unacceptably high rack inlet temperatures. As noted, this can impact reliability and performance of the electronics in the rack, and also lead to device failure in extreme cases.

Data center thermal problems may be addressed using one of at least two approaches. Specifically, by a human operator, with some degree of trial and error, making changes in the layout of perforated tiles, server racks, air-conditioning units, and room geometry (e.g., ceiling, walls, partitions, ducts, type of tiles), or by changing the operating point of the air-conditioning units (e.g., air or liquid flow rate, set point temperatures, etc.). Alternatively, computer-based techniques may be employed to model the data center, simulate several "what if?" scenarios, and then derive a plan for making actual changes to improve cooling within the computing clusters. For both approaches, it would be significant to know the rack airflow rate, as well as the rack power consumed, so that air-conditioning unit infrastructure can be sized and located to provide the requisite cooling, which is not too little (i.e., a reliability problem) or too much (i.e., an energy inefficiency problem). This data is almost never provided in a transparent manner to the room air-conditioning operator. In most real world situations, the rack airflow rate and rack power are unknown quantities that have to be guessed at based on nameplate data, which can lead to significant errors in the thermal design of the data center. Thus, disclosed hereinbelow are various methods and systems to readily determine rack airflow rate and rack power consumption.

Two embodiments are described hereinbelow, one employing an air-to-air heat exchange assembly, and the other an air-to-liquid heat exchange assembly. In both embodiments, air temperature is sensed at the air outlet side of the electronics rack, and coolant inlet temperature and coolant outlet temperature to the heat exchange assembly are sensed. These temperature values are then employed in dynamically determining at least one of airflow rate through the electronics rack or power being consumed at the electronics rack, wherein it is assumed that a known percentage of air egressing from the electronics rack passes through the heat exchange assembly (e.g., 100%). The monitoring method and system described hereinbelow then output the determined airflow rate and/or power consumption of the electronics rack, for example, by displaying the airflow rate and/or power consumption to an operator of the data center. In the embodiments described herein, a single electronics rack is discussed, however, those skilled in the art will understand that the concepts described are readily adapted to a plurality of electronics racks disposed within a data center configuration. For example, each electronics rack within the data center may separately provide the temperature values required to ascertain the airflow rate through and power consumption of that electronics rack to a centralized monitoring unit for the data center.

Figure 3A:
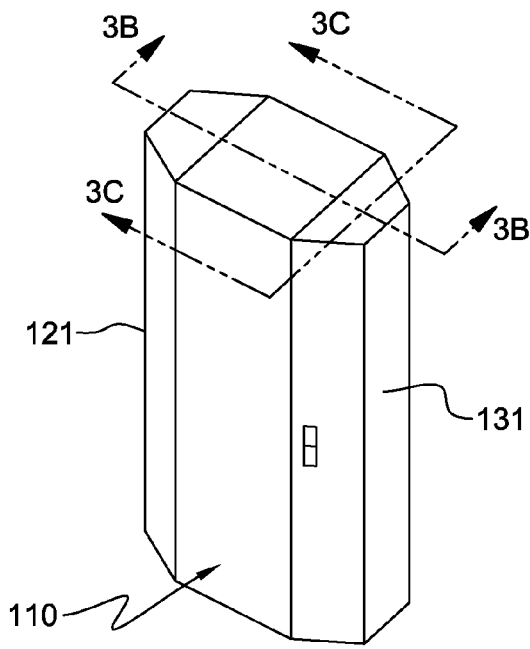
FIG. 3A is an isometric view of the electronics rack of FIG. 2A, modified with monitoring components as depicted in FIGS. 3B & 3C, in accordance with an aspect of the present invention.
Figure 3B:
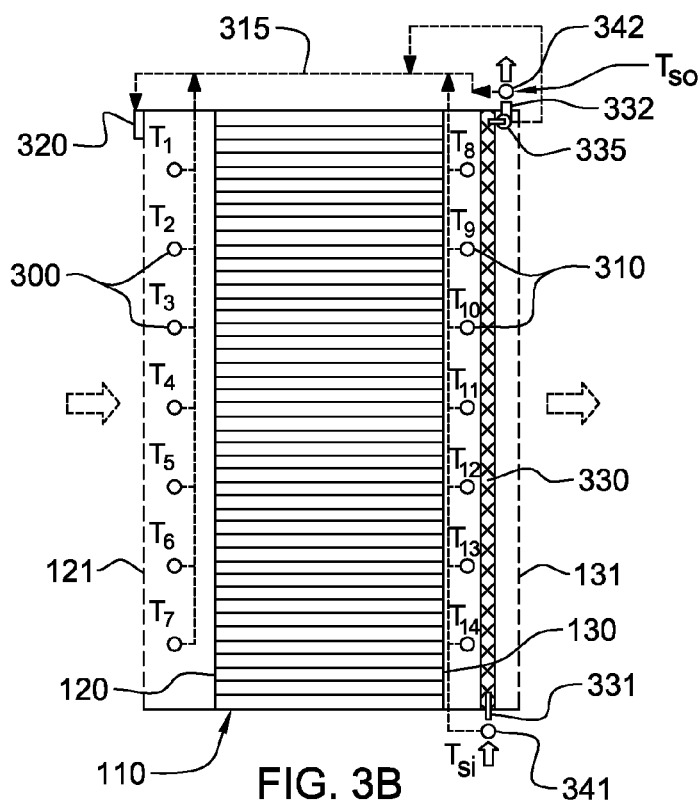
FIG. 3B is a cross-sectional elevational view of the electronics rack with monitoring components of FIG. 3A, taken along line 3B-3B, in accordance with an aspect of the present invention.
Figure 3C:
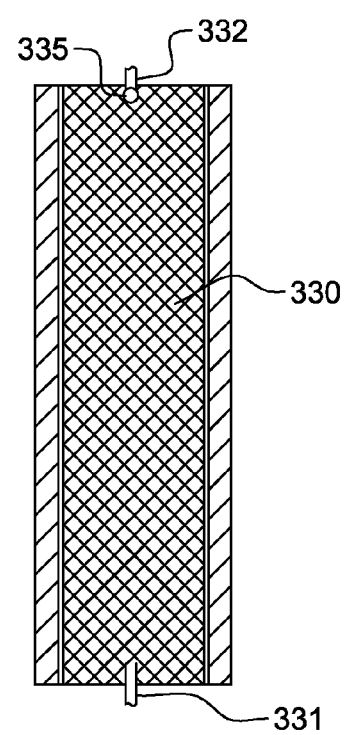
FIG. 3C is a cross-sectional elevational view of the electronics rack with monitoring components of FIG. 3A, taken along line 3C-3C, in accordance with an aspect of the present invention.

FIGS. 3A-3C illustrate one embodiment of an electronics rack with monitoring components, in accordance with an aspect of the invention disclosed herein. Electronics rack 110 again includes an air inlet side 120 and an air outlet side 130, with respective covers 121, 131 which have openings to facilitate airflow from the air inlet side to the air outlet side of the electronics rack. Added in this embodiment are a plurality of rack inlet temperature sensors 300 $T_1$, $T_2$, $T_3$, $T_4$, $T_5$, $T_6$ & $T_7$, and a plurality of rack exhaust temperature sensors 310 $T_8$, $T_9$, $T_{10}$, $T_{11}$, $T_{12}$, $T_{13}$ & $T_{14}$, which are electrically coupled to a control unit 320 via data cables 315.

In this embodiment, an air-to-air heat exchange assembly 330 is located at the air outlet side of electronics rack 110 with the rack exhaust temperature sensors 310 being disposed on the air inlet side of air-to-air heat exchanger 330, as illustrated. Heat exchange assembly 330 may be preexisting in association with the electronics rack or may be disposed at the air outlet side of the electronics rack expressly for facilitating monitoring of airflow rate through and/or power consumed by the electronics rack, in accordance with the concepts disclosed herein. Coolant passing through this heat exchange assembly, which in one embodiment is cooled air, passes through at least one channel extending through the heat exchange assembly. This at least one channel is referred to herein as the "sense loop". Heat exchange assembly 330 includes a coolant inlet 331 and a coolant outlet 332, with coolant outlet 332 being coupled to an air moving device 335 for drawing air through the sense loop of the heat exchange assembly. Fan 335 is shown disposed, by way of example only, at the coolant outlet 332 of heat exchange assembly 330. In addition, an inlet temperature sensor 341 is disposed to sense coolant inlet temperature and an outlet temperature sensor 342 is disposed to sense coolant outlet temperature. Temperature sensors 341, 342 are also coupled via data cables 315 to control unit 320, which as noted above, employs the temperature readings in determining the airflow rate through and power consumed by the electronics rack, as explained further hereinbelow.

The sense loop of the heat exchange assembly is calibrated in the laboratory so that for a certain RPM of fan 335, a known airflow rate through the sense loop is obtained. This data, along with the various sensed temperature values, is sent to control unit 320, which includes logic for automatically determining the rack airflow rate and power consumption. In one example, the determined rack airflow rate and/or power being consumed may be displayed automatically in a transparent manner at the control unit itself, or may be otherwise output for use in managing the data center cooling. As used herein, the word "output" includes display, printing or electronically saving of the determined information, for example, at the control unit or at a central monitoring unit for the data center.

FIGS. 4A & 4B depict one embodiment of an a heat exchange assembly 330 employable in monitoring rack airflow rate and power consumption, as described herein. Referring to both figures collectively, heat exchange assembly 330 is shown to include an inlet plenum 400 in fluid communication with coolant inlet 331 and an outlet plenum 410 in fluid communication with coolant outlet 332. Disposed between inlet plenum 400 and outlet plenum 410 are a plurality of thermally conductive tubes 420, for example, six metal tubes, such as copper tubes, in the illustrated embodiment. A heat exchange assembly support frame 430 may also be provided to provide rigidity to the heat exchange assembly and facilitate mounting of the heat exchange assembly to the electronics rack within the outlet cover at the air outlet side of the electronics rack. In the embodiment of FIGS. 3A-3C, air-moving device 335 is employed to establish a suction flow through a sense loop comprising coolant inlet 331, inlet plenum 400, tubes 420, outlet plenum 410 and coolant outlet 332. If desired, the coolant inlet port may be disposed above a floor tile with a cutout to draw cool air directly from the underfloor plenum, and thereby maximize the temperature difference between the two air streams, that is, the cooled air passing through the sense loop compared with the heated air exhausting out the air outlet side of the electronics rack and passing across the heat exchange assembly.

FIGS. 5A & 5B depict two alternate embodiments of a portion of a heat exchange assembly which may be employed in defining a sense loop for use in determining rack airflow rate and rack power consumption, as described herein. In FIG. 5A, a sense loop air tube 500 is shown surrounded by a plurality of fins 510 extending therefrom. Using this embodiment, air egressing from the electronics rack (not illustrated) passes through the plurality of fins 510 and around the sense loop air tube 500, resulting in the transfer of heat to the coolant passing through the heat exchanger sense loop defined in part by the sense loop air tube 500. FIG. 5A is a conventional fin and tube heat exchanger section, while FIG. 5B illustrates a plate fin and flat tube compact heat exchanger design, which may alternately be employed in the heat exchange assembly disposed at the air outlet side of the electronics rack. In FIG. 5B, the sense loop air tube 520 section comprises a plurality of flat tubes interconnected by thermally conductive fins 530. As in the above-described embodiments, air egressing from the air outlet side of the electronics rack transfers heat to the coolant passing through the sense loop of the heat exchange assembly.

Figure 6:
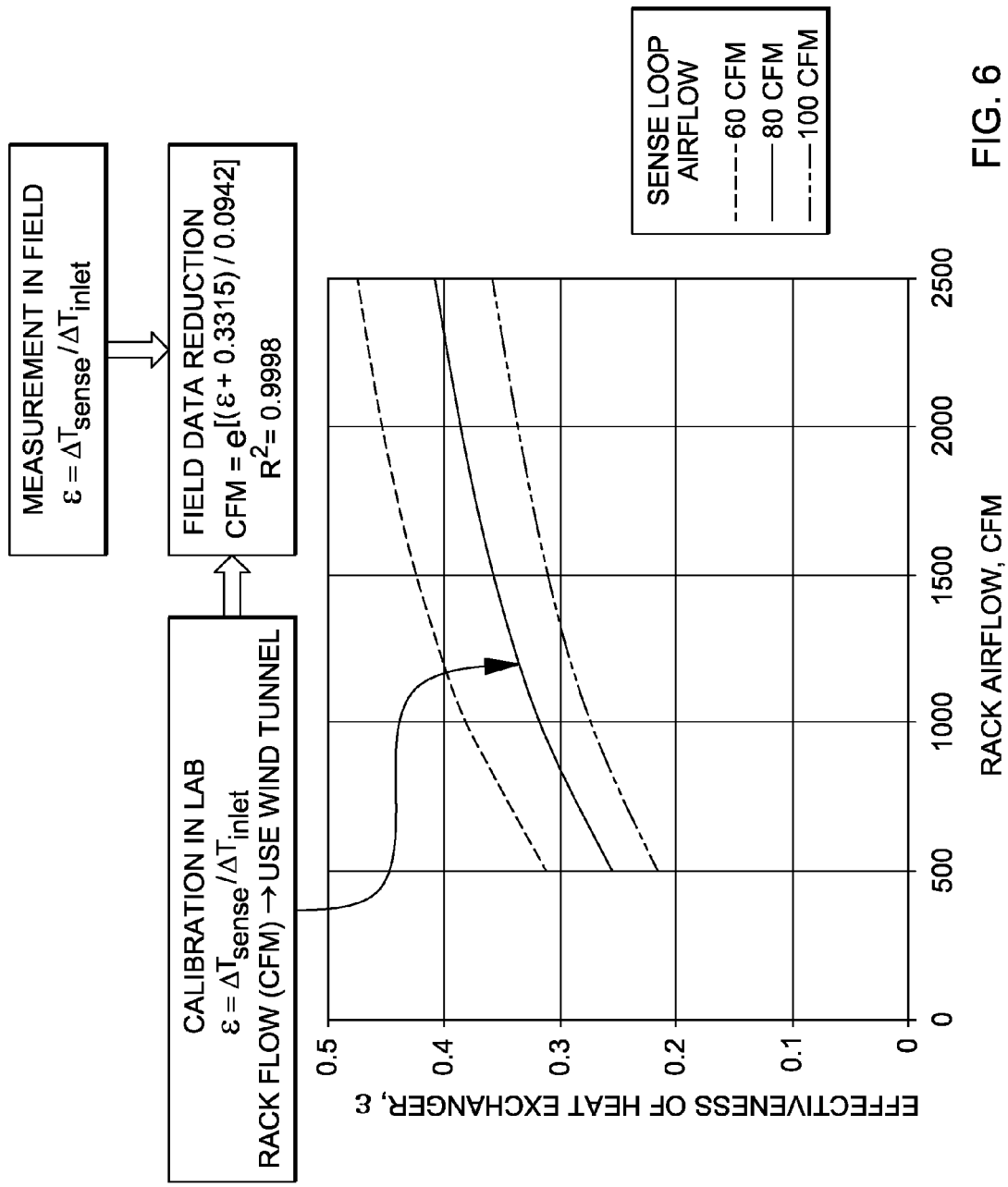
FIG. 6 is a plot of heat exchanger effectiveness versus rack airflow rate (CFM) through the heat exchanger for various calibrated coolant flow rates through the heat exchanger, in accordance with an aspect of the present invention.

FIG. 6 illustrates examples of the underlying physics employed by the processes described herein. As noted, FIGS. 3A-3C illustrate an air-to-air heat exchange assembly embodiment in which air egressing from the electronics rack flows past the metal tubes, thus heating the cooler air flowing within the tubes of the heat exchange assembly. One thermal performance metric of a heat exchanger is its effectiveness ($\epsilon$), which is defined as the ratio of the heat the exchanger is capable of transferring from one stream to another, to the theoretical maximum heat exchange possible for some given inlet temperature values. Effectiveness is a measure of how well a given heat exchanger design performs under certain input conditions. In practical terms, effectiveness can be calculated using the ratio of two temperature difference terms. The numerator is the temperature rise in the fluid (e.g., air) stream with the smaller of the two capacity rates (i.e., within the sense loop). The capacity rate is calculated as the product of the volumetric airflow rate, the specific heat, and the density. The denominator is the temperature difference between the inlet temperature of the hot air stream (i.e., electronics rack exhaust), and the inlet of the cold stream (i.e., the inlet coolant to the sense loop). FIG. 6 depicts various curves illustrating variation of heat exchanger effectiveness with the total electronics rack flow rate, and the sense loop airflow rate. A representative heat exchange design was employed to produce the illustrated plots of typical heat exchanger behavior. Three different plots are illustrated, one each for 60, 80 & 100 CFM sense loop airflow (determined, for example, from the RPMs of the fan drawing air through the sense loop).

Plots of effectiveness versus electronics rack flow rate can be readily generated in a laboratory prior to shipment of an electronics rack with a heat exchange assembly as described herein. Thus, in the field, using the various temperature sensors, and knowledge of the sense loop airflow rate to fan RPM relationship, heat exchanger effectiveness can be determined. Then, using a known relationship (described below) between the effectiveness and the rack flow rate, real-time rack airflow rate can be determined. A representative curve fit expression allowing the calculation of the rack airflow rate when effectiveness is known is shown in FIG. 6 in the box labeled "Field Data Reduction".

Figure 7:
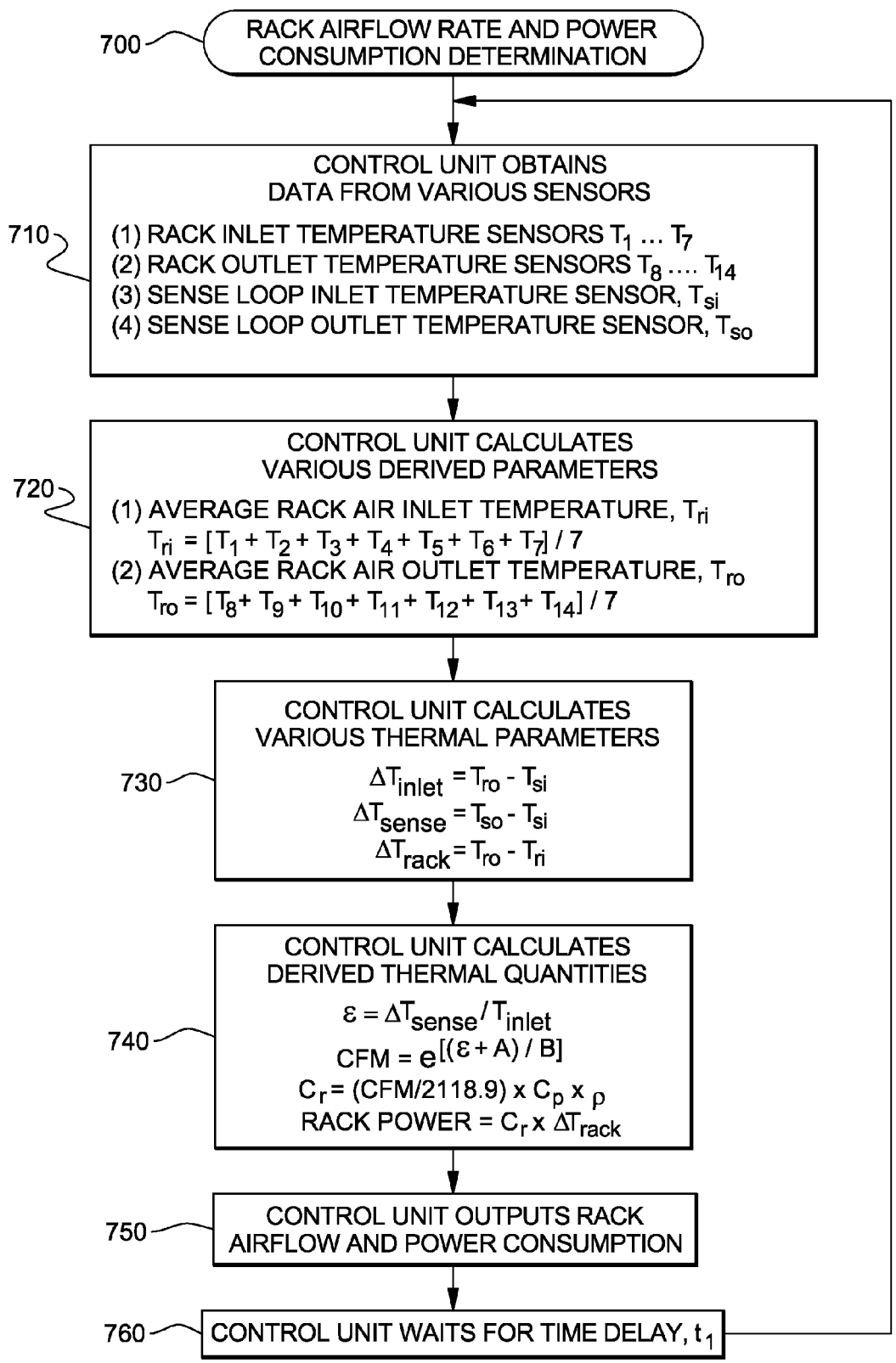
FIG. 7 is a flowchart of one embodiment of processing for determining airflow rate through and power consumption of an electronics rack using the monitoring components of FIGS. 3B & 3C, in accordance with an aspect of the present invention.

FIG. 7 illustrates a flowchart of one embodiment for determining rack airflow rate and power consumption employing the monitoring components of FIGS. 3A-3C. Rack airflow rate and power consumption determination 700 begins with the control unit (or centralized monitoring unit) obtaining data from the various temperature sensors 710. Specifically, rack inlet temperature sensors $T_1 \ldots T_7$ provide air temperature values for air entering the air inlet side of the electronics rack, rack outlet temperature sensors $T_8 \ldots T_{14}$ provide air temperature values for air egressing from the electronics rack, inlet temperature sensor $T_{si}$ provides temperature of air entering the coolant inlet of the sense loop of the heat exchange assembly, and temperature sensor $T_{so}$ provides temperature of air exiting the coolant outlet of the sense loop.

Next, the control unit calculates various derived parameters 720. In this example, the average rack inlet temperature $T_{ri}$ is calculated and the average rack outlet air temperature $T_{ro}$ is calculated by simple averaging of the respective sensed temperature values. More representative temperature values are achieved by this averaging of the inlet air temperatures and averaging of the outlet air temperatures. In an alternate embodiment, more or less temperature sensors may be employed to obtain the air inlet and air outlet temperature values. Area weighted factors could also be employed if a particular sensor is used to represent a larger area than another sensor. In a like manner, in cases where the flow is known to be spatially non-uniform, flow weight factors could also be employed to calculate the average air temperature.

The control display next determines various thermal parameters 730, including $\Delta T_{inlet}, \Delta T_{sense},$ and $\Delta T_{rack}$. These thermal parameters, which are defined in Table 1 below, are then employed in determining effectiveness of the heat exchange assembly, and hence airflow rate through the electronics rack and power consumed by the electronics rack 740. The equations employed in determining efficiency, airflow rate through the electronics rack, capacity rate of the air passing over the heat exchange assembly and rack power are described below. After determining rack airflow rate and power consumed, the results may be output by the control unit or forwarded to a monitoring unit (not shown) for centralized output 750. The control unit then waits a defined time interval $t_1$ before returning to obtain a new set of temperature sensor readings 760, and automatically repeating the transparent determination of rack airflow rate and power consumption.

The variables and equations employed in the flowchart of FIG. 7 are defined as follows:

TABLE 1

| Variable/Equation | Definition |
|---|---|
| $T_1, T_2, T_3, T_4, T_5, T_6, T_7$ | Air temperature values measured via corresponding sensors located at the air inlet side of the rack. |

TABLE 1-continued

| Variable/Equation | Definition |
|---|---|
| $T_8, T_9, T_{10}, T_{11}, T_{12}, T_{13}, T_{14}$ | Air temperature values measured via corresponding sensors located at the air outlet side of the rack. |
| $T_{si}$ | Air temperature measured via sensor located at the coolant inlet of the sense loop |
| $T_{so}$ | Air temperature measured via sensor located at the coolant outlet of the sense loop |
| $T_{ri}$ | Average air temperatures calculated via averaging of data from sensors at rack inlet. |
| $T_{ro}$ | Average air temperatures calculated via averaging of data from sensors at rack exhaust. |
| $\Delta T_{inlet}$ | Temperature difference between the average rack exhaust air ($T_{ro}$) & the inlet sense loop air temperature ($T_{si}$). |
| $\Delta T_{sense}$ | Temperature difference between the inlet and exit sense loop air ($T_{so} - T_{si}$). |
| $\Delta T_{rack}$ | Temperature difference between air at server inlet ($T_{ri}$) & air at server exhaust ($T_{ro}$). |
| $\epsilon$ | Effectiveness of the heat exchanger. |
| CFM | Rack airflow in Cubic Feet per Minute. |
| $C_r$ | Capacity rate of the rack airflow which characterizes the air's ability to carry heat away. It is the product of the volumetric flow rate, the mass density, and the mass specific heat. |
| Rack Power | Power consumed by the rack (or other electronic equipment) located in the rack. |
| $T_{ri} = [T_1 + T_2 + T_3 + T_4 + T_5 + T_6 + T_7]/7$ | Simple spatial temperature averaging. |
| $T_{ro} = [T_8 + T_9 + T_{10} + T_{11} + T_{12} + T_{13} + T_{14}]/7$ | Simple spatial temperature averaging. |
| $\Delta T_{inlet} = T_{ro} - T_{si}$ | This is the temperature difference that drives the exchange of the heat between the two fluid streams (both air in this case). This is commonly known as the "heat exchanger inlet temperature difference". This is the difference in the temperature of two fluid streams entering the heat exchanger. In this case, those temperatures are the exhaust rack air temperature and the inlet sense loop air temperature. |
| $\Delta T_{sense} = T_{so} - T_{si}$ | This is the temperature difference between the sense loop air at the inlet and at the exit. |
| $\rho$ | Mass density of air in kg/m$^3$. |
| $C_p$ | Specific heat of air in J/kg-K. |
| A, B | Constants determined via fitting data using regression analysis. |
| $\Delta T_{rack} = T_{ro} - T_{ri}$ | This is the temperature difference between the rack air at the inlet and at the exit thereof. |
| $\epsilon = \Delta T_{sense}/\Delta T_{inlet}$ | This is the heat exchanger effectiveness. It represents the ratio of the actual heat exchanged between the fluid streams versus the maximum possible heat that could be exchanged. This is a characteristic of the heat exchanger and is determined by its physical design, the thermophysical properties of the materials that are used in its construction, the thermophysical properties of the fluids that flow through it, and the mass flow rates of the fluids that flow through the device. A simple derivation yields the equation used herein to calculate effectiveness. |

More particularly, the heat (q) exchanged between the two air streams via the heat exchange device is given by:

$$q = \epsilon \times C_{min} \times \Delta T_{inlet} \quad (1)$$

Where $\epsilon$ is the heat exchanger effectiveness, and $\Delta T_{inlet}$ is the inlet temperature difference that is driving the heat exchange between the two fluid streams (e.g., air) that are flowing through the heat exchanger. In the embodiment shown in FIGS. 3A-3C, $\Delta T_{inlet}$ is equal to ($T_{ro}-T_{si}$). Also, in equation (1) above, the parameter $C_{min}$ is the minimum of the two fluid stream capacity rates. Since the flow through the sense loop (~100 CFM) is an order of magnitude lower than that through the rack (>1000 CFM), the sense loop air flow capacity rate, $C_s$, is the minimum capacity rate. This gives:

$$q = \epsilon \times C_s \times (T_{ro} - T_{si}) \quad (2)$$

The heat transferred to the sense loop air stream will increase the air temperature of this sense loop air, and can be calculated using:

$$q = C_s \times (T_{so} - T_{si}) \quad (3)$$

Combining equations (2) and (3) to solve for $\epsilon$, yields, $$\epsilon = \Delta T_{sense}/\Delta T_{inlet}$$

This effectiveness is a function of the rack flow rate and can be calibrated in the laboratory to yield the following function, $$CFM = e^{[(\epsilon + A)/B]}$$

Where A and B are constants fitted using regression analysis.

The rack flow in SI units which are m³/s is obtained by dividing CFM by 2118.9 (CFM/(meter³/sec)), and the rack airflow capacity rate ($C_r$) in SI units is calculated by multiplying the volumetric flow rate (m³/s) by the air mass density (kg/m³) and the air specific heat (J/kg-K), $$C_r = (CFM/2118.9) \times C_p \times \rho$$

Now that the rack air flow capacity rate is known, the heat added to the air stream by the heat generating components in the rack can be calculated using knowledge of the difference in air temperature between the inlet air ($T_{ri}$) and the exhaust air ($T_{ro}$), $$\text{Rack Power} = C_r \times \Delta T_{rack} = C_r \times (T_{ro} - T_{ri})$$

Figure 8A:
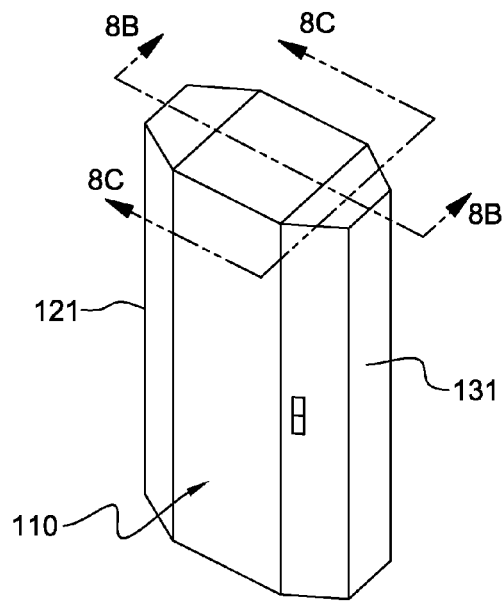
FIG. 8A is an isometric view of the electronics rack of FIG. 2A, modified with an alternate embodiment of monitoring components as depicted in FIGS. 8B & 8C, in accordance with an aspect of the present invention.
Figure 8B:
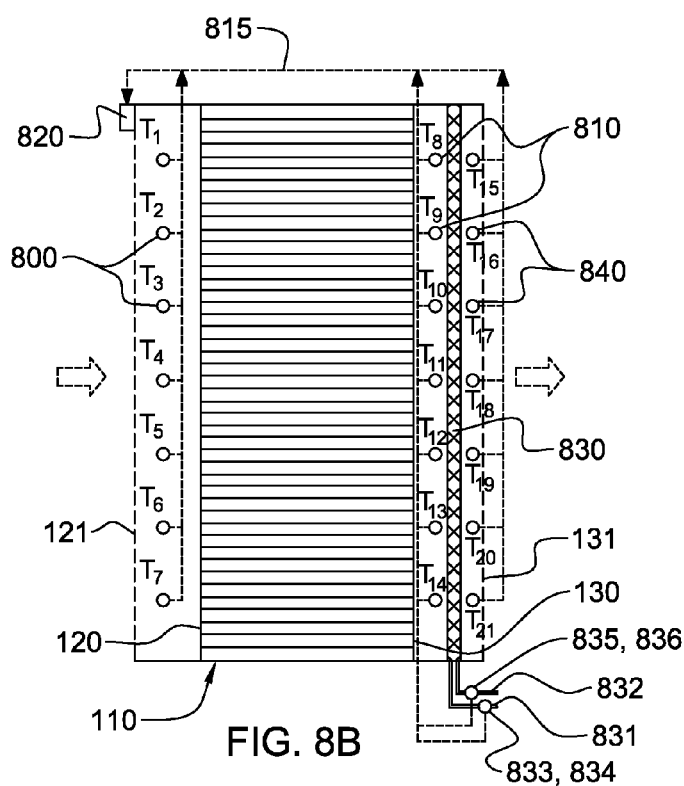
FIG. 8B is a cross-sectional elevational view of the electronics rack with monitoring components of FIG. 8A, taken along line 8B-8B, in accordance with an aspect of the present invention.
Figure 8C:
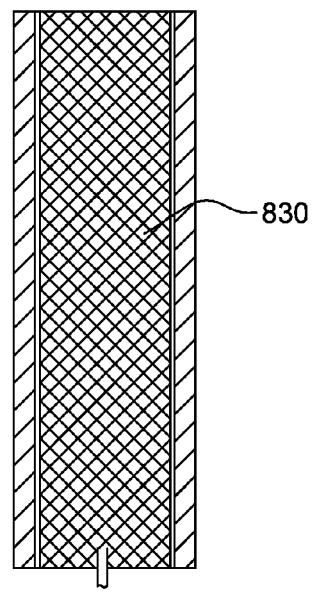
FIG. 8C is a cross-sectional elevational view of the electronics rack with monitoring components of FIG. 8A, taken along line 8C-8C, in accordance with an aspect of the present invention.

FIGS. 8A-8C illustrate an alternate embodiment of an electronics rack with monitoring components, in accordance with an aspect of the invention disclosed herein. In this embodiment, electronics rack 110 again includes an air inlet side 120 and an air outlet side 130, with respective covers 121, 131, which have openings to facilitate airflow from the air inlet side to the air outlet side of the electronics rack. The embodiment further includes a plurality of rack inlet temperature sensors 800 $T_1$, $T_2$, $T_3$, $T_4$, $T_6$ & $T_7$, and a plurality of rack outlet temperature sensors 810 $T_8$, $T_9$, $T_{10}$, $T_{11}$, $T_{12}$, $T_{13}$ & $T_{14}$, which are electrically coupled to a control unit 820 via data cables 815.

In this embodiment, an air-to-liquid heat exchange assembly 830 is located at the air outlet side of electronics rack 110, with the rack exhaust temperature sensors 810 being disposed on the air inlet side of the air-to-liquid heat exchange assembly 830, as illustrated. Heat exchange assembly 830 may be preexisting in association with the electronics rack, for example, to reduce the heat load on the room air-conditioning units within the data center, or may be disposed at the air outlet side of the electronics rack expressly for facilitating monitoring of airflow rate and/or power being consumed by the electronics rack, in accordance with the concepts disclosed herein.

In the embodiment of FIGS. 8A-8C, coolant passing through the heat exchange assembly is a liquid, and in one example is water. This liquid coolant passes through at least one channel within the heat exchange assembly, again referred to herein as the "sense loop". By way of example, the heat exchange assembly could again comprise a configuration similar to that depicted in FIGS. 4A-5B. Heat exchange assembly 830 includes a coolant inlet 831, and coolant outlet 832, with the coolant inlet 831 having associated therewith a coolant inlet temperature sensor 833, and a coolant inlet pressure sensor 834, and the coolant outlet 832 having associated therewith a coolant outlet temperature sensor 835, and a coolant outlet pressure sensor 836. Coolant inlet and outlet temperature sensors 833 & 835 measure inlet and outlet temperature, respectively, of the liquid coolant passing through the sense loop of the heat exchange assembly, while coolant inlet and outlet pressure sensors 834 & 836 monitor inlet and outlet pressure, respectively, of coolant flowing into and out of the sense loop. These coolant temperature and pressure sensors are also coupled via data cables 815 to control unit 820. The monitoring components further include, in this embodiment, a plurality of heat exchanger outlet temperature sensors 840 $T_{15}$, $T_{16}$, $T_{17}$, $T_{18}$, $T_{19}$, $T_{20}$ & $T_{21}$ disposed at the air exhaust side of the heat exchanger between the heat exchanger and the outlet cover 131.

Figure 9:
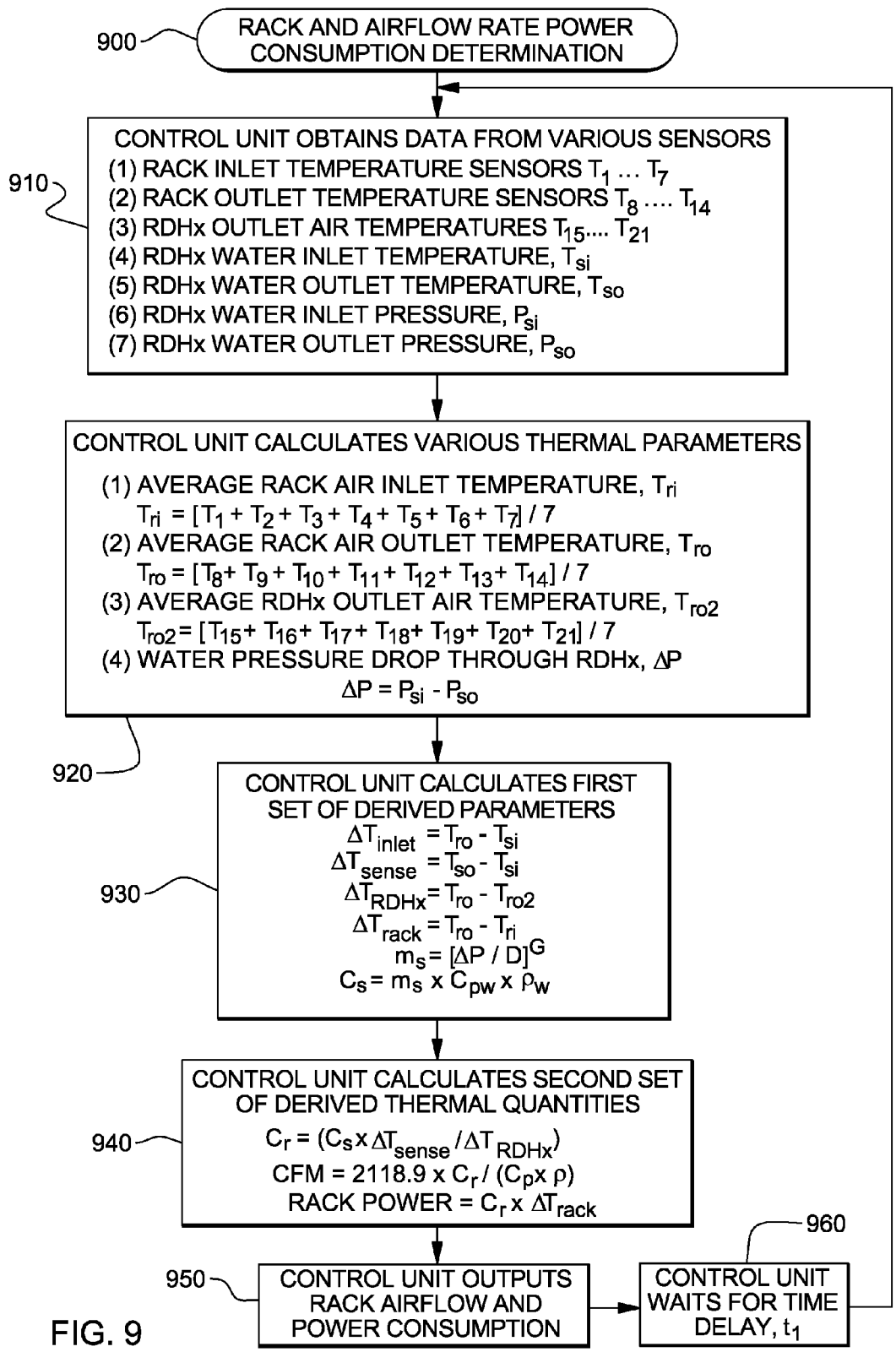
FIG. 9 is a flowchart of one embodiment of processing for determining airflow rate through and power consumption of an electronics rack using the monitoring components of FIGS. 8B & 8C, in accordance with an aspect of the present invention.

FIG. 9 illustrates a flowchart of one embodiment for determining rack airflow rate and rack power consumption employing the monitoring components of FIGS. 8A-8C. Rack airflow rate and power consumption determination 900 begins with the control unit (or centralized monitoring unit) obtaining data for various temperature and pressure sensors 910. Specifically, rack inlet temperature sensors $T_1 \ldots T_7$ provide air temperature values for air entering the air inlet side of the electronics rack, outlet temperature sensors $T_8 \ldots T_{14}$ provide air temperature values for air egressing from the electronics rack (and entering the heat exchange assembly), temperature sensors $T_{15} \ldots T_{21}$ provide air temperature values for air egressing from the heat exchange assembly, coolant inlet temperature sensor $T_{si}$ provides temperature of the liquid coolant at the inlet to the sense loop of the heat exchange assembly, coolant outlet temperature sensor $T_{so}$ provides temperature of the coolant at the coolant outlet of the sense loop, inlet pressure sensor $P_{si}$ provides coolant pressure at the coolant inlet to the sense loop, and pressure sensor $P_{so}$ provides coolant pressure at the outlet of the sense loop.

Next, the control unit calculates various thermal parameters 920. In this example, the average rack inlet temperature $T_{ri}$ is calculated and the average rack outlet temperature $T_{ro}$ is calculated by simple averaging of the respective sensed temperature values. Similarly, the average heat exchanger outlet air temperature $T_{ro2}$ is calculated by simple averaging of the temperature sensors $T_{15} \ldots T_{21}$. Further, the coolant pressure drop ($\Delta P$) through the heat exchange assembly is calculated by determining the difference between the coolant pressure at the coolant inlet to the sense loop minus the coolant pressure at the coolant outlet of the sense loop.

The control unit next determines various derived parameters 930, including $\Delta T_{inlet}$, $\Delta T_{sense}$, $\Delta T_{RDHX}$, $\Delta T_{rack}$, $m_s$, and $C_s$. These parameters, which are defined in Table 2 below, are then employed in determining a capacity rate for airflow through the heat exchange assembly, airflow rate through the heat exchange assembly, and hence through the electronics rack, and rack power being consumed at the electronics rack 940. The equations employed in determining capacity rate, airflow rate through the electronics rack and rack power are similar to those described above in connection with the processing of FIG. 7. After determining rack airflow rate and power consumed, the results may be displayed by the control unit or otherwise output, or forwarded to a centralized monitoring unit of the data center for centralized display or other output 950. Processing then waits a defined time interval $t_1$ before automatically returning to obtain a new set of temperature and pressure sensor readings 960, and repeating the determination of rack airflow rate and/or power consumption.

The variables and equations employed in the flowchart of FIG. 9 are defined in Table 1 above, and Table 2 below.

TABLE 2

| Variable/Equation | Definition |
|---|---|
| $T_{15}$, $T_{16}$, $T_{17}$, $T_{18}$, $T_{19}$, $T_{20}$, $T_{21}$ | Air temperature measured via sensors located at the rear of the heat exchanger (RDHX). |
| $P_{si}$ | Water pressure measured via sensor located at |

TABLE 2-continued

| Variable/Equation | Definition |
|---|---|
| $P_{so}$ | the coolant inlet of the sense loop. Water pressure measured via sensor located at the coolant outlet of the sense loop. |
| $\Delta T_{RDHX}$ | Temperature difference between air at RDHX inlet ($T_{ro}$) and air at RDHX exhaust ($T_{ro2}$). |
| $T_{ro2}$ | Spatially averaged air temperature at the rear of the rear door heat exchanger (RDHX). |
| $\Delta P$ | Water pressure drop across the rear door heat exchanger between inlet/outlet sense points. |
| $m_s$ | Water mass flow rate through the rear door heat exchanger. |
| $C_s$ | Water capacity rate through the rear door heat exchanger. |
| $C_{pw}$ | Water specific heat which can be determined via commonly available technical sources. |
| $\rho_w$ | Water mass density which can be determined via commonly available technical sources. |
| $T_{ro2} = [T_{15} + T_{16} + T_{17} + T_{18} + T_{19} + T_{20} + T_{21}]/7$ | Simple spatial temperature averaging. |
| $\Delta T_{RDHX} = T_{ro} - T_{ro2}$ | This is the temperature rise in the air as it flows through the rear door heat exchanger. Using the knowledge of the heat that is transferred to the water in the RDHX, the air capacity rate can be calculated, and thus also the air volumetric airflow rate and consequently, the rack power that is being rejected to the air. |
| $\Delta P = P_{so} - P_{si}$ | This is the temperature difference between the sense loop air at the inlet and at the outlet. |
| $m_s = [\Delta P/D]^G$ | This is the mass flow rate of the water flowing through the sense loop which is also the rear door heat exchanger. The constants D and G can be determined via laboratory testing or calibration and can then be used in conjunction with the $\Delta P$ to determine the mass flow rate. |
| $C_s = m_s \times C_{pw} \times \rho_w$ | This is the capacity rate of the water flowing through the RDHX. |
| $C_s \times \Delta T_{sense}$ | This is the heat gained by the water stream in the rear door heat exchanger. |
| $C_r = (C_s \times \Delta T_{sense}/\Delta T_{RDHX})$ | This is the air capacity rate that is flowing through the rear door heat exchanger. Since the heat lost by the air is gained by the water, this is derived from a simple energy balance where the heat gained and lost are equated. |
| $CFM = 2118.9 \times C_r/(C_p \times \rho)$ | When the $C_r$ is divided by the product of the air specific heat and the air density, it yields the air volumetric air flow rate in SI units ($m^3/s$). Multiplying this value by 2118.9 yields the air volumetric airflow rate in cubic feet per minute (CFM). |

The detailed description presented above is discussed in terms of procedures which can be executed on a computer, a network or a cluster of computers. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as closing or opening, which are commonly associated with manual operations performed by a human operator. No such intervention of a human operator is necessary in the operations described herein which form part of the present invention; the operations may be implemented as automatic machine operations. Useful machines for performing the operations of the present invention include general purpose digital computers or similar devices.

Aspects of the invention are preferably implemented in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention and/or to structure its components in accordance with a system of the invention.

Aspects of the invention may be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of monitoring an electronics rack comprising a heat exchange assembly disposed at an air outlet side thereof, the method comprising:
    sensing air temperature at the air outlet side of the electronics rack;
    sensing coolant temperature at a coolant inlet to the heat exchanger and coolant temperature at a coolant outlet of the heat exchanger;
    determining airflow rate through the electronics rack, the determining employing the sensed air temperature at the air outlet side of the electronics rack and the sensed coolant temperature at the coolant inlet and outlet of the heat exchange assembly, wherein a known percentage of air egressing from the electronics rack passes through the heat exchange assembly; and
    outputting the determined airflow rate through the electronics rack.

2. The method of claim 1, wherein sensing air temperature at the air outlet side of the electronics rack comprises sensing air temperature between the air outlet side of the electronics rack and the heat exchange assembly at a plurality of locations and averaging the sensed temperatures at the plurality of location to obtained the sensed air temperature at the air outlet side of the electronics rack.

3. The method of claim 1, wherein the determining comprises determining the airflow rate through the electronics rack employing in part a difference between the sensed coolant temperatures at the coolant outlet and coolant inlet of the heat exchange assembly ($\Delta T_{sense}$).

4. The method of claim 1, wherein the heat exchange assembly comprises an air-to-air heat exchanger, and wherein the method further comprises determining effectiveness of the air-to-air heat exchanger employing a difference between the sensed coolant temperatures at the coolant outlet and coolant inlet of the air-to-air heat exchanger ($\Delta T_{sense}$), and a difference between the sensed air temperature at the air outlet side of the electronics rack and the sensed coolant temperature at the coolant inlet of the air-to-air heat exchanger ($\Delta T_{inlet}$), and wherein the determining comprises determining airflow rate through the electronics rack employing the determined effectiveness of the air-to-air heat exchanger.

5. The method of claim 4, further comprising pre-calibrating the air-to-air heat exchanger to correlate $\Delta T_{sense}$ and $\Delta T_{inlet}$ to effectiveness of the heat exchanger for one or more coolant flow rates through the heat exchanger, and wherein the method further comprises obtaining coolant flow rate through the heat exchanger and employing coolant flow rate through the heat exchanger and effectiveness of the heat exchanger in determining airflow rate through the heat exchanger and hence through the electronics rack.

6. The method of claim 4, wherein the method further comprises periodically, automatically performing the sensing air temperature, the sensing coolant temperature, the determining and the outputting.

7. The method of claim 4, wherein effectiveness ($\epsilon$) of the heat exchanger is defined as:

$$\varepsilon = \frac{\Delta T_{sense}}{\Delta T_{inlet}}$$

and wherein employing effectiveness of the heat exchanger in determining airflow rate through the electronics rack includes determining coolant flow rate through heat exchanger, wherein for the determined coolant flow rate through the heat exchanger, airflow rate through the heat exchanger is defined as:

$$CFM = e^{[(\epsilon + A)/B]}$$

where A and B are constants obtained by pre-calibrating the heat exchanger for the determined coolant flow rate through the heat exchanger.

8. The method of claim 7, further comprising sensing air temperature at the air inlet side of the electronics rack, and wherein the determining further comprises determining power being consumed at the electronics rack by determining capacity rate ($C_r$) of the electronics rack airflow as a product of airflow rate through the electronics rack, mass density of the airflow through the electronics rack, and mass specific heat of the airflow through the electronics rack, and using the capacity rate ($C_r$) of the rack airflow to determine rack power by multiplying the capacity rate ($C_r$) of the electronics rack airflow by a difference between air temperatures at the air inlet and air outlet sides of the electronics rack ($\Delta T_{rack}$).

9. The method of claim 8, further comprising sensing air temperature at a plurality of locations at the air inlet side of the electronics rack and averaging the sensed temperatures at the plurality of locations at the air inlet side to obtain the air temperature at the air inlet side of the electronics rack, and sensing air temperature at a plurality of locations at the air outlet side of the electronics rack and averaging the sensed temperatures at the plurality of locations at the air outlet side of the electronics rack to obtain the sensed air temperature at the air outlet side of the electronics rack.

10. The method of claim 1, wherein the heat exchange assembly comprises an air-to-liquid heat exchanger, and wherein the method further comprises:
sensing coolant pressure at the coolant inlet to the heat exchanger and coolant pressure at the coolant outlet of the heat exchanger;
sensing air temperature at an air outlet side of the heat exchanger ($T_{ro2}$), and wherein sensing air temperature at the air outlet side of the electronics rack comprises sensing air temperature between the air outlet side of the electronics rack and the heat exchanger ($T_{ro}$);
determining capacity rate ($C_r$) of air flowing across the heat exchanger employing coolant mass flow rate through the heat exchanger, and a difference between the sensed coolant temperatures at the coolant outlet and coolant inlet of the heat exchanger ($\Delta T_{sense}$), and a difference between the sensed air temperatures at the air outlet and air inlet sides of the heat exchanger ($\Delta T_{RDHX}$); and
employing capacity rate of air flowing across the heat exchanger in determining the airflow rate though the electronics rack or power being consumed at the electronics rack.

11. The method of claim 10, further comprising determining the coolant mass flow rate through the air-to-liquid heat exchanger employing a difference between the sensed coolant pressure at the coolant inlet to the heat exchanger ($P_{si}$) and the sensed coolant pressure at the coolant outlet of the heat exchanger ($P_{so}$), and by pre-calibrating the air-to-liquid heat exchanger, wherein the mass flow rate ($m_s$) of coolant through the heat exchanger is defined as:

$$m_s = [\Delta P/D]^G$$

wherein D and G are constants obtained by pre-calibrating the heat exchanger for a determined coolant flow rate through the heat exchanger.

12. The method of claim 10, wherein sensing air temperature at the air inlet side of the heat exchanger ($T_{ro}$) comprises sensing air temperature at a plurality of locations at the air inlet side of the heat exchanger and averaging the sensed air inlet temperatures to obtain the air temperature at the air inlet side of the heat exchanger, and wherein sensing air temperature at the air outlet side of the heat exchanger ($T_{ro2}$) comprises sensing air temperature at a plurality of locations at the air outlet side of the heat exchanger and averaging the sensed air outlet temperatures to obtain the sensed air temperature at the air outlet side of the heat exchanger, and wherein the method further comprises waiting a defined interval before automatically repeating the determining of at least one of airflow rate through the electronics rack or power being consumed at the electronics rack.

13. The method of claim 10, further comprising sensing air temperature at the air inlet side of the electronics rack, and the determining comprises determining power being consumed at the electronics rack by employing the determined capacity rate ($C_r$) of airflow through the heat exchanger and a difference between the sensed air temperature at the air outlet side of the electronics rack and the sensed air temperature at the air inlet side of the electronics rack ($\Delta T_{rack}$).

14. The method of claim 13, wherein capacity rate ($C_r$) of air flowing through the heat exchanger is determined as:

$$C_r = (C_s \times \Delta T_{sense}/\Delta T_{RDHX})$$

where $C_s$ is the coolant capacity rate through the air-to-liquid heat exchanger, and wherein the coolant capacity rate is determined as:

$$C_s = m_s \times C_{pw} \times \rho_w$$

where:
$m_s$ = coolant mass flow rate through the air-to-liquid heat exchanger;
$C_{pw}$ = coolant specific heat for a given coolant temperature; and
$\rho_w$ = coolant mass density.

15. The method of claim 13, wherein the determining comprises determining airflow rate through the electronics rack and power being consumed at the electronics rack, the determining airflow rate through the electronics rack comprising:

$$CFM = 2118.9 \times C_r/(C_p \times \rho)$$

where $C_p$ is the coolant specific heat and $\rho$ is the coolant mass density, and wherein determining power being consumed at the electronics rack comprises:

$$\text{rack power} = C_r \times \Delta T_{rack}.$$

16. A monitoring system for an electronics rack, the monitoring system comprising:
a heat exchange assembly disposed at an air outlet side of the electronics rack;
at least one temperature sensor disposed at the air outlet side of the electronics rack between the electronics rack and the heat exchange assembly;
a coolant temperature sensor disposed at a coolant inlet to the heat exchange assembly and a coolant temperature sensor disposed at a coolant outlet of the heat exchange assembly; and
a control unit coupled to the temperature sensors for obtaining sensed temperature values and for employing the sensed temperature values in dynamically determining and outputting airflow rate through the electronics rack.

17. The monitoring system of claim 16, wherein the heat exchange assembly comprises an air-to-air heat exchanger, and wherein the control unit dynamically determines effectiveness of the air-to-air heat exchanger employing a difference between the sensed coolant temperatures at the coolant outlet and coolant inlet of the heat exchanger ($\Delta T_{sense}$), and a difference between the sensed air temperature at the air outlet side of the electronics rack and the sensed coolant temperature at the coolant inlet of the heat exchanger ($\Delta T_{inlet}$), and employs effectiveness of the heat exchanger in determining the airflow rate through the electronics rack.

18. The monitoring system of claim 17, wherein effectiveness ($\epsilon$) of the heat exchanger is defined as:

$$\varepsilon = \frac{\Delta T_{sense}}{\Delta T_{inlet}}$$

and wherein the control unit determines coolant flow rate through the heat exchanger, and hence the electronics rack, as:

$$CFM = e^{[(\varepsilon - A)/B]}$$

where A and B are constants obtained by pre-calibrating the heat exchanger for the determined coolant rate through the heat exchanger.

19. The monitoring system of claim 16, wherein the heat exchange assembly comprises an air-to-liquid heat exchanger, and wherein the monitoring system further comprises a coolant pressure sensor at the coolant inlet to the heat exchanger, and a coolant pressure sensor at the coolant outlet of the heat exchanger, and a temperature sensor at an air outlet side of the heat exchanger ($T_{ro2}$), and wherein the at least one temperature sensor disposed at the air outlet side of the electronics rack is disposed between the electronics rack and the heat exchanger and thus senses air temperature at an air inlet side of the heat exchanger ($T_{ro}$), and wherein the control unit is further coupled to the pressure sensors and to the air temperature sensor at the air outlet side of the heat exchanger, and further determines capacity rate ($C_r$) of air flowing through the heat exchanger employing coolant mass flow rate through the heat exchanger, and a difference between the sensed coolant temperatures at the coolant outlet and coolant inlet of the heat exchanger ($\Delta T_{sense}$), and a difference between the sensed air temperatures at the air outlet and air inlet sides of the heat exchanger ($\Delta T_{RDHX}$), and employs capacity rate ($C_r$) of air flowing through the heat exchanger in determining the power being consumed at the electronics rack.

20. The monitoring system of claim 19, further comprising at least one temperature sensor disposed at an air inlet side of the electronics rack, and the control unit determines power being consumed at the electronics rack by employing the determined capacity rate ($C_r$) of airflow through the heat exchanger and a difference between the sensed air temperature at the air outlet side of the electronics rack and the sensed air temperature at the air inlet side of the electronics rack ($\Delta T_{rack}$), and wherein the control unit further comprises determining airflow rate through the electronics rack as:

$$CFM = 2118.9 \times C_r / (C_p \times \rho)$$

where $C_p$ is the coolant specific heat and $\rho$ is the coolant mass density, and wherein the control unit further determines power being consumed at the electronics rack as:

$$\text{rack power} = C_r \times \Delta T_{rack}.$$

* * * * *